United States Patent [19]

Mizuno et al.

[11] Patent Number: 5,757,243

[45] Date of Patent: May 26, 1998

[54] HIGH FREQUENCY SYSTEM INCLUDING A SUPERCONDUCTIVE DEVICE AND TEMPERATURE CONTROLLING APPARATUS

[75] Inventors: Koichi Mizuno; Akira Enokihara, both of Nara; Hidetaka Higashino, Kyoto; Kentaro Setsune, Osaka, all of Japan

[73] Assignee: Matsushita Electric Industrial Co., Ltd., Osaka, Japan

[21] Appl. No.: 649,884

[22] Filed: May 13, 1996

[30] Foreign Application Priority Data

May 25, 1995 [JP] Japan ................... 7-126579
Sep. 13, 1995 [JP] Japan ................... 7-235611

[51] Int. Cl.⁶ ........................................ H04B 3/18
[52] U.S. Cl. ............. 331/107 S; 331/69; 327/527; 327/528; 257/31; 257/32; 257/33; 257/34; 257/35; 257/36
[58] Field of Search ................... 331/107 S, 69; 327/528, 527; 257/31, 32, 33, 34, 35, 36

[56] References Cited

U.S. PATENT DOCUMENTS

| 4,344,052 | 8/1982 | Davidson | 333/222 |
|---|---|---|---|
| 4,468,635 | 8/1984 | Lukens et al. | 331/107 |
| 4,470,023 | 9/1984 | Lukens et al. | |
| 4,970,868 | 11/1990 | Grebe et al. | 62/51.1 |
| 5,065,582 | 11/1991 | Seifert | 62/45.1 |
| 5,114,912 | 5/1992 | Benz | 505/1 |
| 5,339,457 | 8/1994 | Kawasaki et al. | 455/333 |

FOREIGN PATENT DOCUMENTS

| 0 372 951 | 6/1990 | European Pat. Off. |
| 0 441 229 | 8/1991 | European Pat. Off. |
| 0 597 617 | 5/1994 | European Pat. Off. |
| 2-60203 | 2/1990 | Japan |
| 6-224638 | 8/1994 | Japan |
| 2 244 403 | 11/1991 | United Kingdom |

OTHER PUBLICATIONS

Satchell, et al."Arrays of High Temperature Superconductor Josephson Junctions", IEEE Transactions on Applied Superconductivity, vol. 3, No. 1, Mar. 1993, pp. 2273–2276.

*Primary Examiner*—Timothy P. Callahan
*Assistant Examiner*—An T. Lu
*Attorney, Agent, or Firm*—Merchant, Gould, Smith, Edell, Welter & Schmidt, P.A.

[57] ABSTRACT

An effective high frequency oscillator is made of a plurality of Josephson devices. A high frequency converter as a high frequency circuit is made of the high frequency oscillator, nonlinear superconductor devices, and transmission line. Josephson devices are connected in parallel to make a superconductor module. Then superconductive modules are connected in series for high frequency via a phase locking circuit such as a thin film type capacitor to make the high frequency oscillator. Consequently, the high frequency oscillator is used as a local oscillator for a frequency converter. The high frequency system comprises a high frequency package housing a high frequency circuit, a cooling unit including a low temperature stage in thermal contact with the high frequency package, and a shielding case for housing the high frequency circuit and the low temperature stage. The high frequency system of the present invention provides a small-sized and power-saving high frequency circuit having operational stability.

12 Claims, 12 Drawing Sheets

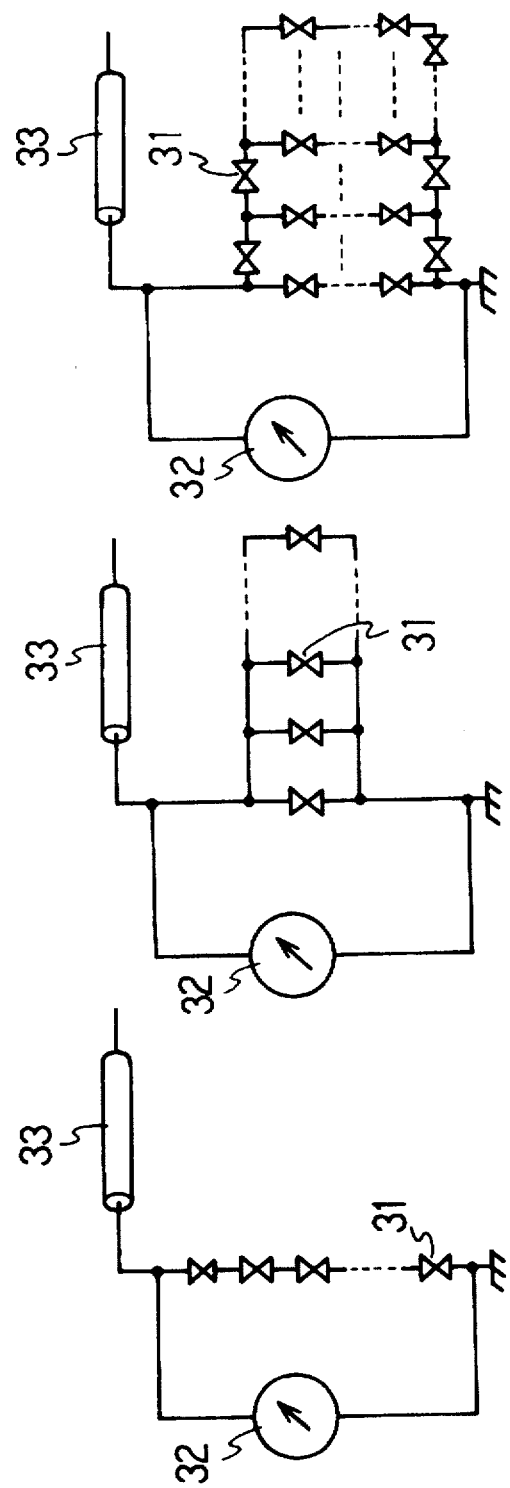

HIGH FREQUENCY SYSTEM INCLUDING A SUPERCONDUCTIVE DEVICE AND TEMPERATURE CONTROLLING APPARATUS

FIELD OF THE INVENTION

The invention relates to a high frequency oscillator including a superconductive device for a high frequency communication system. More specifically, the invention relates to a high frequency system such as a frequency converter.

BACKGROUND OF THE INVENTION

A high frequency communication system using a carrier having 1–40 GHz band has been practically used for satellite communication or mobile communication. In such a communication system, an audio signal (whose base band is approximately 3 KHz) and a video signal (whose base band is approximately 30 MHz) must be up-converted to the high frequency carrier (1–40 GHz). The technique of taking the output of various signal waves by down-converting the high frequency carrier to the base band signal is also required. Frequency is converted by the heterodyne mixing method with nonlinearity of a semiconductive device.

According to the heterodyne method, when two signals having different frequencies are combined in a nonlinear device, there are output frequencies which are equal to the sum and difference of the combining frequencies. Consequently, the heterodyne method is used for converting frequency. At the side of a transmitter, a high frequency wave generated by the local oscillator and signal frequency are mixed by a monlinear device. Then the sum of the frequency components (high frequency signal) is amplified and output from an antenna. Meanwhile, at the side of a receiver, high frequency signal received at the antenna is mixed with a local oscillation frequency generated by the local oscillator and the difference of the frequency components is output as a signal frequency.

The basic element parts of the heterodyne method are an oscillating device for the local oscillator, a nonlinear device for freuqency mixing, and an amplifying device for amplifying the high frequency input signal or the base band signal in which frequency was converted. Conventionally, the high frequency oscillating device such as a quartz oscillator, Gun diode or the like was used for a local oscillator; a Shottky diode was used for the frequency converting device; and a transistor such as HEMT, HBT or the like was used for the high frequency amplifying device. Consequently, the frequency converter or the signal amplifier was provided by combining the above-mentioned devices.

In a communication system of the higher frequency region, which will come into practical use in the future, the semiconductive device of the prior art will never operate. One device that can operate under such conditions is the Josephson device.

When voltage is applied between the electrodes of the Josephson device, there is an alternating oscillation by the alternating Josephson effect. The oscillation frequency (f) is expressed by the following equation (1);

$$f = 2eV/h \quad (1)$$

where "e" is electric charge, "h" is the Planck's constant, and "V" is the voltage between electrodes of the Josephson device. Consequently, the oscillation frequency changes by altering the voltage between the terminals of the Josephson device. The value is 483 GHz/mV. Additionally, the maximum frequency is determined by the superconductor energy gap ($2\Delta$) of the superconductor to be used. When the Josephson device made of Nb ($2\Delta$-2 meV) is used, which is a metallic superconductor, the value is approximately 1 THz; when $Y_1Ba_2Cu_3O_7$-$\sigma$($2\Delta$-20 meV) is used, which is an oxide high temperature superconductor, the value is approximately 10 THz.

Moreover, the current amplitude of the Josephson oscillation is equivalent to the superconductor critical current (Ic). The available high frequency power that can be taken from one Josephson device (Po) is expressed by the following equation (2) (Rn denotes device resistance);

$$Po = \frac{1}{8}(Ic^2 \cdot Rn) \quad (2)$$

When Po is roughly calculated from Ic (approximately 1 mA) and Rn (1$\Omega$), which are generally obtained from experiments, the Po is a small value on the order of 100 nW. When impedance mismatching between the Josephson device and transmission line is present, undesired reflection occurs at a point where the transmission line and the Josephson junction are connected. As a result, an output of the high frequency power becomes small.

In order to obtain a practical output level of the high frequency oscillating power, methods of arraying Josephson devices have been suggested. Some examples are introduced in the following documents.

(1) Examples in which the Josephson devices are connected in series.

Arthur Davidson, U.S. Pat. No. 4,344,052; James E. Lukens, Aloke K. Jain, Paul M. Mankiewich, U.S. Pat. No. 4,468,635; James E. Lukens, Aloke K. Jain, Paul M. Mankiewich, U.S. Pat. No. 4,470,023; Siyuan Han, A. H. Worsham, J. E Lukens, IEEE Trans. Appl. Super. 3,2489–2492 (1993); J. Edstam, H. K. Olsson, IEEE Trans. Appl. Super. 3,2496–2499 (1993).

(2) Examples in which the Josephson devices are connected in parallel.

K. Wan, B. Bi, A. K. Jain, L. A. Fetter, S. Han, W. H. Mallison, J. E. Lukens, IEEE Trans. Magn. 27,3339–3342 (1991); Aleksander Pance, Michael J. Wengler, IEEE Trans. Appl. Super. 3,2481–2484 (1993); J. A Stern, H. G. LeDuc, J. Zmuidzinas, IEEE Trans. Appl. Super. 3,2485–2488 (1993); J. S. Satchell, R. G. Humphreys, J. A. Edwards, N. G. Chew, IEEE Trans. Appl. Super. 3,2273–2280 (1993).

(3) Examples in which the Josephson devices are arranged two-dimensionally.

Samuel P. Benz, U.S. Pat. No. 5,114,912; P. A. A. Booi and S. P. Benz, IEEE Trans. Appl. Super. 3,2493–2495 (1993).

In U.S. Pat. Nos. 4,344,052, 4,468,635, 4,470,023 out of the above-mentioned documents, there are proposed the methods in which the array of the Josephson devices is connected to the normal high frequency transmission line so that the high frequency power is actually used. In these cases, the Josephson devices are inserted in series to the high frequency transmission line.

At present, a high frequency communication system using carrier having 1–40 GHz band is practically used for satellite communication or mobile communication. In the future, the high frequency communication system will be used in the higher frequency region. As described above, as an example of the device that can operate even in the higher region where the prior semiconductive devices can not operate, there are provided the superconductive devices showing a nonlinear property or the Josephson device. The subjects of high frequency systems including superconductive devices in the field of communication will be explained as follows.

(1) Operational Stability of the High Frequency Circuit

A superconductive device is sensitive to temperature. In order to operate the high frequency circuit using a superconductor stably, the surrounding temperature should be kept constant. Additionally, since the superconductor device responds sensitively to the outside electromagnetic noise, an electromagnetic shield for shutting out the outside noise is required.

(2) Highly Sensitive Frequency Converting Device

In the heterodyne method to be used for converting frequency in the high frequency communication field, a Shottky diode is used as a frequency converting device. The minimum allowable input of the Shottky diode is quite high. Thus, in order to secure an input signal level, a pre-amplifier is placed before the input of the Shottky diode. Additionally, since the local oscillation power necessary for the Shottky diode is relatively large, in order to obtain plenty of local oscillation power, an amplifying device is required to be provided behind the normal local oscillator. If the number of expensive semiconductor amplifiers that can operate in the high frequency region can be reduced, the frequency converter can effectively be simplified and also be lowered in price. In order to solve the problems, the sensitivity of a nonlinear device to be used for converting frequency should be enhanced and the necessary local oscillation power should be as small as possible.

(3) High Frequency Oscillator

In order to make the heterodyne converter in the several tens of GHz band, the local oscillating device and the nonlinear device become especially important element parts.

Generally, some of the oscillating devices for high frequency region are used for the purpose of obtaining the stability in frequency, and others are used for the purpose of varying frequency. The former includes the device that generates the stable basic signal such as a quartz oscillator, Gun diode or the like. The latter includes the device called a voltage controlled oscillator (VCO) whose oscillating frequency changes with the voltage applied. The oscillator that oscillates at several tens of GHz was expensive, and the oscillator whose frequency is variable in a wide range was large-scale. In order to provide a high frequency radiocommunication for widespread use, an oscillator that has a simple construction and a stable frequency and also alters frequency in a wide band is necessary.

As the oscillator that can solve the problems, there is provided an oscillator made of the Josephson device. In the case of using the Josephson device as a high frequency oscillator and obtaining the oscillation output by the use of general high-frequency transmission line, the following problems will occur; to obtain higher output of high frequency oscillation and to narrow the band width of the oscillation.

(3-a) To Obtain the Higher Output of High Frequency Oscillator

As described above, high frequency power taken from a Josephson device is considerably small. Therefore, the method of arraying the Josephson devices have been suggested. However, in order to obtain higher output by combining the output of several Josephson devices, it is necessary to identify (synchronize) the oscillating frequency and phase of each Josephson device. At the same time, in order to effectively take the oscillation output, impedance matching with the transmission line is also important.

(3-b) To Obtain the Narrower Line width of the Oscillating Frequency

The Josephson device becomes a voltage controlled oscillating device. As is apparent from the relation between voltage and frequency shown in equation (1), the device can oscillate at high frequency at a small voltage. This means that the change in voltage directly influences the change in oscillation frequency. Moreover, the fluctuation in the voltage causes an increase of oscillation linewidth. In the high frequency region where the present invention is applied, the oscillation linewidth of a Josephson device widens in proportion to the voltage noise between the electrodes of the device. In the case of using the oscillator made of the Josephson array, narrowing the oscillation linewidth is one of the problems.

(4) To Make A Multichannel System

At the present time when the demand of the high frequency communication is rapidly increasing, it is desired to secure more channels within a limited frequency band. In the case of taking a signal of each channel by the one-stage frequency conversion, although it depends on the construction of a device, a narrow-band filter corresponding to the width of each channel and local oscillator for multichannel corresponding to the frequency of each channel are required.

An object of the present invention is to solve the above-mentioned problems and to provide a high frequency system comprising a superconductive device.

SUMMARY OF THE INVENTION

An object of the present invention is to solve the above-mentioned problems in making a high frequency system using a superconductive device.

In order to solve the above-mentioned problems, the high frequency system of the present invention comprises a high frequency package housing a high frequency circuit including a superconductive device, a cooling unit having a low temperature stage which thermally contacts the high frequency package, and a shielding case for housing the high frequency package and the low temperature stage. The configuration enhances the thermal stability and an operational stability of the high frequency circuit including a superconductive device. Moreover, effective shielding against electromagnetic noise can be provided by using a metallic shielding case.

The superconductive device such as the Josephson device, which responds sensitively to a slight electromagnetic wave and has a nonlinear property, permits the heterodyne operation. Additionally, the frequency converter using a superconductive device can operate by using the very small local oscillation power. Consequently, a practical heterodyne frequency converter can be made by using the superconductive Josephson device for the local oscillator or the like. Consequently, the pre-amplifier necessary to the frequency converter of the prior art can be eliminated.

The high frequency oscillator can be made by connecting the Josephson devices in series or in parallel to the electric power source for driving. The Josephson device has the alternating Josephson effect in which a high frequency oscillation occurs according to the voltage between electrodes. The Josephson device also has a high frequency oscillation phenomenon called a magnetic flux flow oscillation, which occurs when the magnetic field is applied to the device (See Antonio Barone and Gianfranco Paterno, Physics and Applications of The Josephson Effect, 1982 John Wiley & Sons, Inc., New York, U.S.A.). Although the oscillation power from a device is slight in these phenomena, the maximum frequency theoretically reaches to several hundreds of gigahertz (GHz) to several terahertz (THz). Since the alternating Josephson effect has a property that the oscillation frequency changes with the voltage between electrodes, the voltage controlling oscillator can easily be made by using the Josephson device and a variable voltage source. Moreover, practical output can be obtained by simultaneously operating the Josephson devices which are connected in series or in parallel. When the Josephson devices are connected in series, a voltage amplitude of the oscillation increases. When the Josephson devices are connected in parallel, a great deal of oscillation current can be provided.

Moreover, it is preferable that the predetermined number of the Josehpson devices (e.g. three devices) are connected in parallel to make a superconductive module and the high frequency oscillator can be made by connecting the above-mentioned superconductive modules for high frequency in series via the phase locking circuit such as a thin film type capacitor. According to this construction, the impedance of the whole oscillator circuit can be designed optionally while synchronizing an oscillation phase of each Josephson device. Moreover, the high frequency oscillation power can be taken to the transmission line with little loss by matching impedance with output transmission line. Consequently, the voltage controlled high frequency oscillator having a high output which operates in wide gigahertz band can be made in practice.

The phase locking circuit includes not only a capacitor component of a thin film type capacitor or the like, but also an inductance component. The impedance of the high frequency oscillator as a high frequency circuit can be varied by altering the places where the phase locking circuit is connected to the superconductive module.

The high frequency oscillator having a higher output can be made by inserting the high frequency amplifier comprising semiconductor circuits between the above-mentioned high frequency circuit and the transmission line. Moreover, the bandwidth of oscillation output can be narrowed by placing a resonator adjacent to the high frequency transmission line. The bandwidth also can be narrowed by making the transmission line itself an oscillator construction.

A space occupied by the superconductive module is along the high frequency transmission line and less than one-eighth of electric wavelength of the resonant frequency so that the high frequency circuit can be treated as a lumped element circuit. As a result, the circuit can be designed easily. Moreover, the superconductive modules are spaced at distances corresponding to multiples of a half wave-length along the high frequency transmission line so that the oscillator having high output and narrow oscillation linewidth can be provided.

The high frequency circuit further comprises a coupler having input terminals and output terminals and a nonlinear device placed between the output terminal of the coupler and the high frequency transmission line so that an excellent frequency converter can be provided.

The superconductor device includes an oxide (high temperature) superconductor so that a simple cooling unit made of liquid nitrogen can be used. Consequently, a high frequency system having a high performance can be provided at a relatively low cost. In addition, noise in the device is reduced by cooling.

A multichannel frequency converter can be made by using amplifiers having different center frequencies. It is preferable from the above-mentioned point of view that the amplifier comprises an oxide superconductor.

BRIEF DESCRIPTION OF THE DRAWING

FIG. 2A is a circuit diagram of the oscillator in which Josephson devices are connected in series for the high frequency circuit so as to make the high frequency system shown in FIG. 1.

FIG. 2B is a circuit diagram of the oscillator in which the Josephson devices are connected in parallel.

FIG. 2C is a circuit diagram of the oscillator in which the Josephson devices are connected in series and in parallel.

DETAILED DESCRIPTION OF THE INVENTION

The invention will be explained in detail with reference to the attached figures and the following examples.

Figure 1:
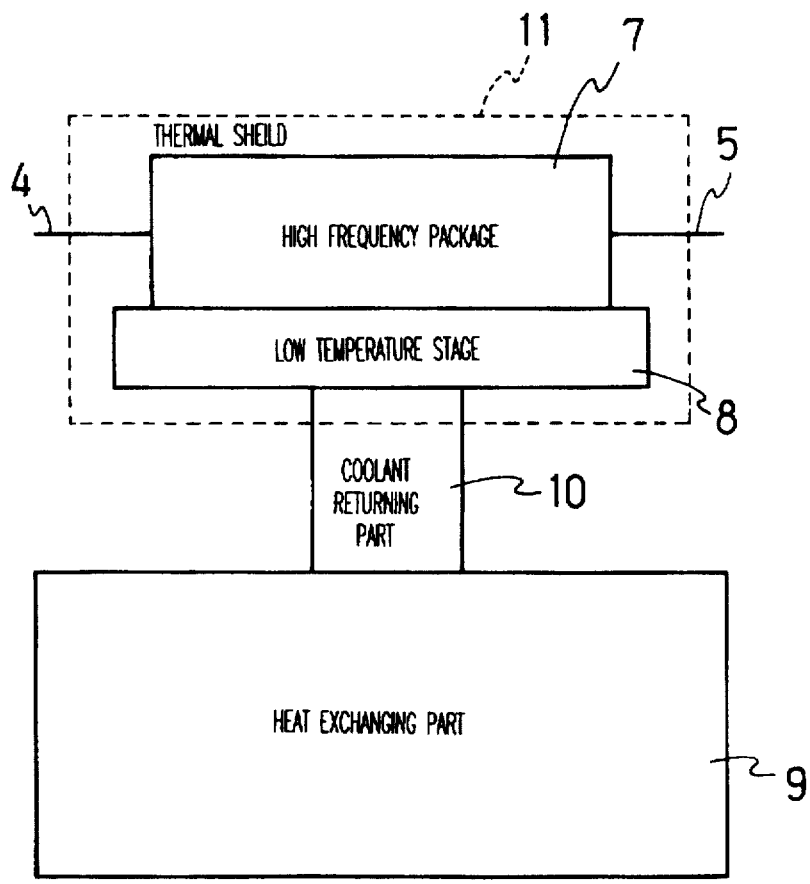
FIG. 1 is a schematic diagram of the high frequency system made with a superconductive device of the present invention.

FIG. 1 is a schematic diagram of the high frequency system of the present invention. The system is provided with the high frequency converter, which is a high frequency circuit including the superconductive device, a cooling unit, and a shield surrounding both. The frequency converter is contained in the high frequency package 7 and connected with the outside circuit through the use of the high frequency transmission line for input 4 and the high frequency transmission line for output 5. For the cooling unit, a Stirling refrigerator, a Gifford-McMahon (GM) refrigerator, a low temperature block cooled by liquid coolant which has a good thermal conductivity, an electronic cooling system such as a Peltier device, or a cooling system which is made by combining the above can be used.

The high frequency package 7 including the high frequency circuit thermally contacts the low temperature stage 8, which is a low temperature part of the cooling unit. The low temperature stage 8 and high frequency package 7 are generally fastened together securely, for example, with screws. However, in order to secure an excellent thermal conductivity, it is effective that various pastes, grease, metallic foil or metallic powder are put in between the low temperature stage 8 and high frequency package 7. It is also effective if the high frequency package and low temperature stage are soldered together.

Furthermore, the thermal shield 11 surrounding the high frequency package 7 and the low temperature stage 8 is provided. The thermal shield 11 may be a metallic cover which is cooled down to lower temperatures, or a Dewar vessel that is filled with low temperature fluid. Moreover, combining several of these enhances the thermal shielding effectiveness and temperature stability of the high frequency circuit. Additionally, the thermal conductivity to the outside can be decreased by reducing pressure in the shielding case, which also improves the temperature stability of the high frequency circuit.

It is preferable that the thermal shield is made by such materials as copper, aluminum or the like that show an excellent electric conductivity so that it can act as an electromagnetic shield. However, when low frequency magnetic flux is needed to be shielded, materials having a high permeability, such as Permalloy, μ-metal, nickel alloy or the like may be used.

FIG. 2A-2C show the circuit diagrams of the oscillator as an example of the high frequency circuit comprising the superconducitve device. FIG. 2A is a type in which the Josephson devices 31 are connected in series; FIG. 2B is a type in which the Josephson devices 31 are connected in parallel; and FIG. 2C is an array type in which the Josephson devices 31 are connected both in series and in parallel. Output is taken through the outside high frequency transmission line 33. By making the output from an electric power source 32 variable, oscillation frequency output to the transmission line 33 varies. Consequently, the oscillator operates as a frequency variable oscillator.

Figure 3A:
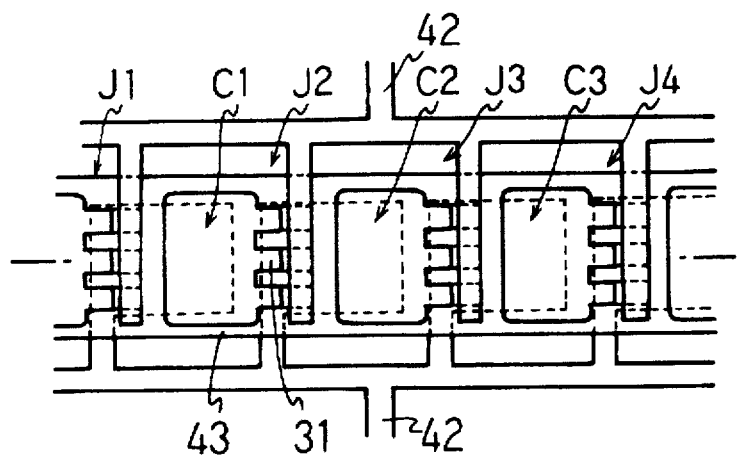
FIG. 3A–3C respectively show a top view, a sectional view, and an equivalent circuit diagram of the example of the oscillator as a high frequency circuit using the Josephson device.
Figure 3B:
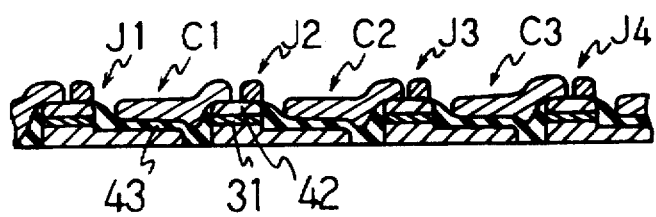
Figure 3C:
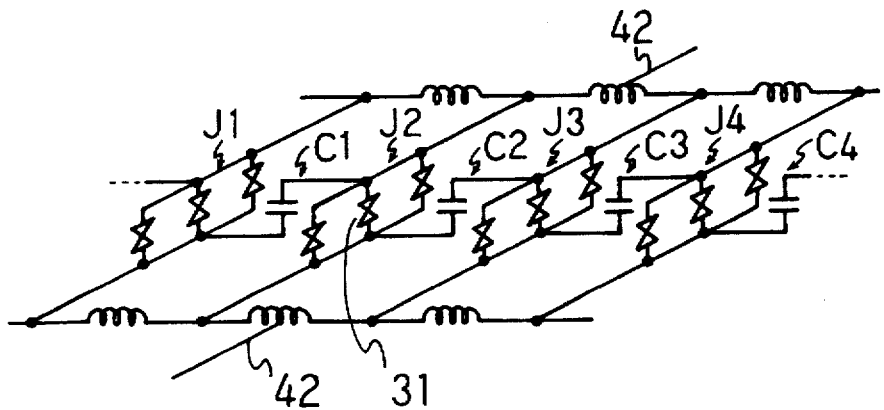

FIG. 3A-3C illustrate the diagrams of the main part of the high frequency circuit of the oscillator according to the alternative example of the high frequency circuit comprising superconductive devices. FIG. 3A is a top view, 3B is a sectional view, and 3C is an equivalent circuit diagram. According to this example, three Josephson devices 31 are connected in parallel to make one superconductor module. And several superconductor modules J1-J4 are connected to the DC bias line 42 such that current bias is provided in parallel to the modules. Consequently, the terminal voltage of each Josephson device is identified, resulting in the identified oscillation frequency. Moreover, as shown in FIG. 3C, predetermined parts of the superconductor modules J1-J4 are connected via the phase circuit C1-C3 comprising thin film capacitors. Thus, a configuration is provided in which each phase of the high frequency signal is identified. Consequently, the high frequency oscillation power of each superconductive module are combined effectively so that the amplitude of the whole oscillation current can be enlarged.

Moreover, by properly selecting the number of superconductor modules and the number of the Josephson devices forming the superconductor modules, the impedance of the whole oscillator can be adjusted to 50Ω. The high frequency transmission line to be connected to this oscillator is a micro-strip type transmission line or a coplaner type transmission line designed at 50Ω. Therefore, in order to make impedance matching between oscillator and transmission line, the output impedance of the oscillator is required to be 50Ω.

Figure 12:
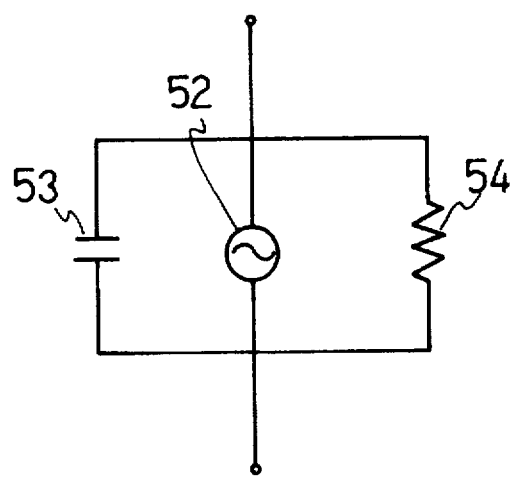
FIG. 12 is an equivalent circuit diagram of the Josephson device.

The Josephson devices are commonly illustrated by an equivalent circuit as shown in FIG. 12. The equivalent circuit comprises current source 52 showing both direct and alternating superconductive current, device capacitance 53, and device resistance 54. The device capacitance of the Josephson device used for high frequency is usually made to be so small as to be ignored. The resistance of the superconductive modules is decreased in proportion to the number of the superconductor devices to be connected in parallel. However, since the superconductive modules for high frequency are connected in series via the phase locking circuit, the impedance of the oscillation circuit can be adjusted by properly selecting the number of the superconductive devices. Consequently, the impedance matching to the outside transmission line of 50Ω can be made and high frequency power can effectively be achieved. Moreover, according to the configuration of the oscillator of the present invention, the impedance of the oscillator can be optionally designed and an array having a different value of the impedance can easily be made in practice with substantially identical Josephson devices.

Figure 4A:
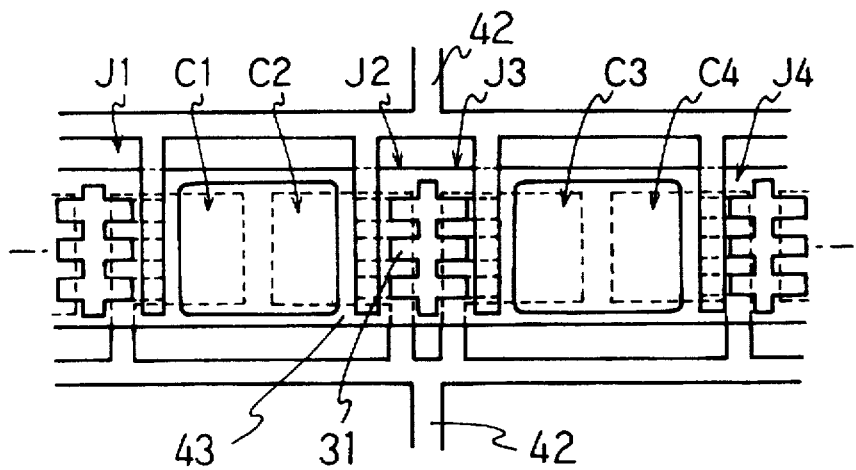
FIG. 4A–4C respectively show a top view, a sectional view and an equivalent circuit diagram of an alternative example of the oscillator as a high frequency circuit using the Josephson devices.
Figure 4B:
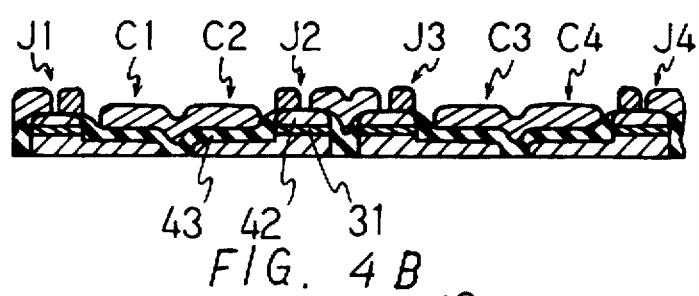
Figure 4C:
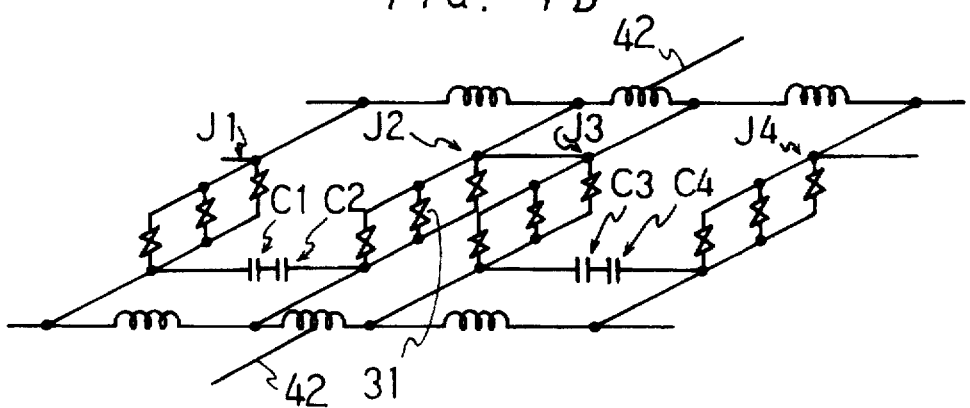

FIG. 4A-4C illustrate the main part of the circuit of the oscillator according to an alternative example of the high frequency circuit. FIG. 4A is a top view, 4B is a sectional view, and 4C is an equivalent circuit. As with FIG. 3A-3C, three Josephson devices 31 are connected in parallel to make one superconductor module. And several superconductor modules J1-J4 are connected to the DC bias line 42 such that current bias is provided in parallel to the modules. Predetermined parts of the superconductor modules J1-J4 are connected via the phase circuit C1-C3 comprising thin film capacitors. Consequently, a construction is provided in which each phase of the high frequency signal can be provided. The difference in construction from FIG. 3A-3C is the connecting point of the phase locking circuit. As with the configuration of FIG. 3A-3C, by selecting properly the number of superconductor modules and the number of the Josephson devices forming the superconductor modules, the impedance of the whole oscillator can be adjusted to 50Ω.

Although the phase locking circuits are made of thin film type capacitors in FIG. 3A-3C and FIG. 4A-4C, other configurations that determine the phase of the high frequency power can be used. The circuits including a resistance component or an inductance component may be used. However, each Josephson device is required to be connected in parallel to a direct current.

Figure 5:
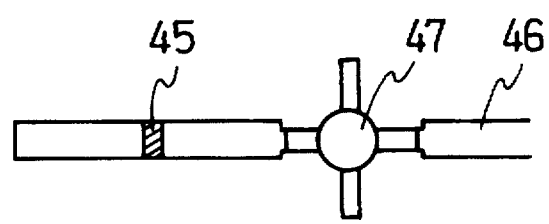
FIG. 5 is a conceptional view illustrating a high frequency oscillator having a high frequency electric power amplitude part as a high frequency circuit of the high frequency system.

FIG. 5 shows an example of the connection of the high frequency oscillator 45 using the above-mentioned Josehpson devices and the high frequency power amplifier 47 using normal semiconductor devices. The high frequency power amplifier 47 amplifies the output from the high frequency oscillator 45 and outputs it to the high frequency transmission line 46. As a semiconductor device, a FET made of compound semiconductor is preferable, however any device that operates in the desired frequency band can be used.

Figure 6A:
FIG. 6A–6C respectively show schematic diagrams of three examples of the high frequency oscillating device comprising a resonator as a high frequency circuit.
Figure 6B:
Figure 6C:
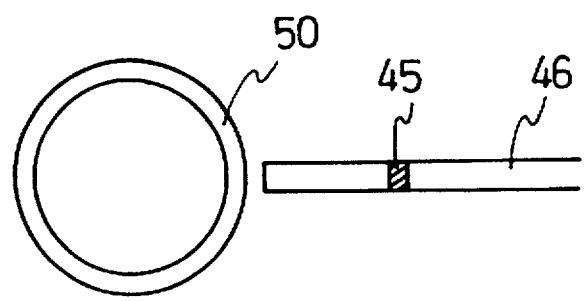

FIG. 6A-6C show the examples in which a resonator is combined with the high frequency oscillator using the Josephson devices to narrow the oscillation linewidth. According to FIG. 6A, the transmission line type resonator having half wavelength 48 is combined with the high frequency oscillator. According to FIG. 6B, a dielectric resonator 49 is placed adjacent to the transmission line 46. According to FIG. 6C, thin film ring resonator 50 is used. In all cases, although it depends on the coefficient of the coupling between the resonators and the lines, the oscillator linewidth is narrower than that using a single high frequency oscillating system. The high frequency transmission line 46 itself connecting to the high frequency oscillator 45 may have a resonance construction. In this case, the oscillation linewidth can be narrowed while keeping the circuit size small.

Figure 7:
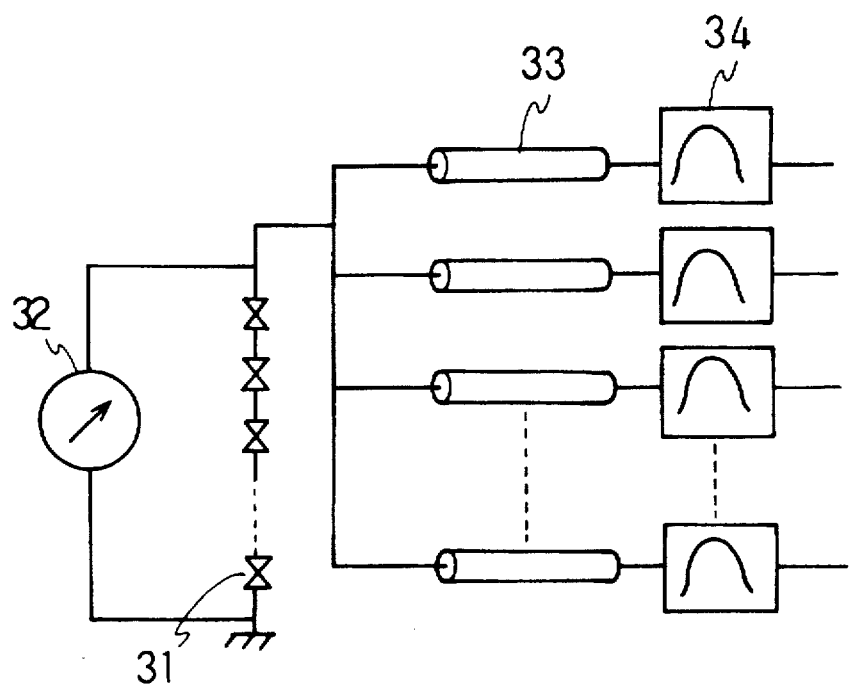
FIG. 7 is a conceptional view illustrating a multichannel oscillator having the Josephson devices as a high frequency circuit.

FIG. 7 shows the configuration in which several resonance type filters 34 are connected to the output of the high frequency oscillator using the Josephson devices so as to narrow the bandwidth of each output. FIG. 7 also shows the multichannel oscillator system that can change the output frequency by altering the voltage of the power source for driving oscillator 32. Each output from the multichannel may be combined. Also the output from the separate terminals may be used. The high frequency oscillator 31 is not limited to a series type. It may be a parallel type or array type.

Figure 8:
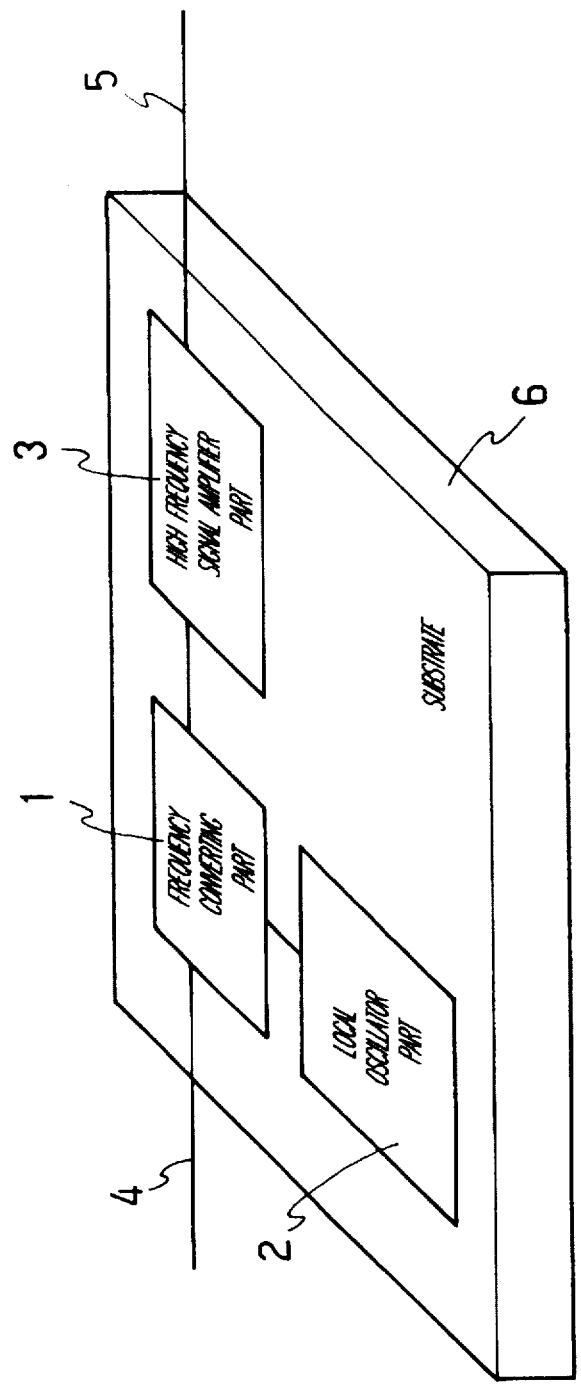
FIG. 8 is a schematic block diagram of the frequency converter for the high frequency circuit comprising a superconductor device.

FIG. 8 is a schematic diagram showing the example of the frequency convertor as a high frequency circuit. The local oscillator part comprising the Josephson oscillating device and superconductor devices such as the Josephson device for a frequency mixer are placed on the same substrate to make the main part of the frequency converter. As shown in FIG. 8, the frequency converter part of the present invention comprises the transmission line for the input 4, the transmission line for output 5, the frequency converting part 1, the local oscillator part 2 and the high frequency signal amplifier part 3. The frequency converter part 1 comprises a superconductive device having a nonlinear property. The local oscillator part 2 is the oscillator using the several Josephson devices as described above. The output from the frequency converting part 1 is amplified by the high frequency signal amplifier part 3 including semiconductor devices to be output on the transmission line for output 5.

The frequency converting part 1, the local oscillator part 2 and the high frequency signal amplifier part 3 are placed on the substrate 6. As shown in FIG. 1, the substrate 6 is contained in the high frequency package 7 that is thermally connected to the low temperature stage 8 of a temperature controlling system (cooler). The temperature controlling system is provided with heat exchanging part 9, a coolant returning part 10 and a low temperature stage 8. It is preferable that thermal shield 11 is placed so as to shield the low temperature stage 8 and high frequency package 7 thermally from the outside. Additionally, the frequency converter 1, the local oscillator part 2, and the high frequency signal amplifier part 3 may be placed on the different substrates and connected respectively. Since the high frequency signal amplifier part 3 can operate even at the room temperature, only the frequency convertor 1 and the local oscillator part 2 may be contained in the high frequency package 7 on the low temperature stage 8, and the high frequency signal amplifier part 3 may be placed outside. It is also preferable to construct the high frequency signal amplifier part 3 using a semiconductive device such as HEMT, HBT, cryo-CMOS or the like which can operate at a low temperature. Additionally, any device having nonlinear property can be used for the frequency converting device, including a normal semiconductor such as a transistor, a diode or the like.

Figure 9:
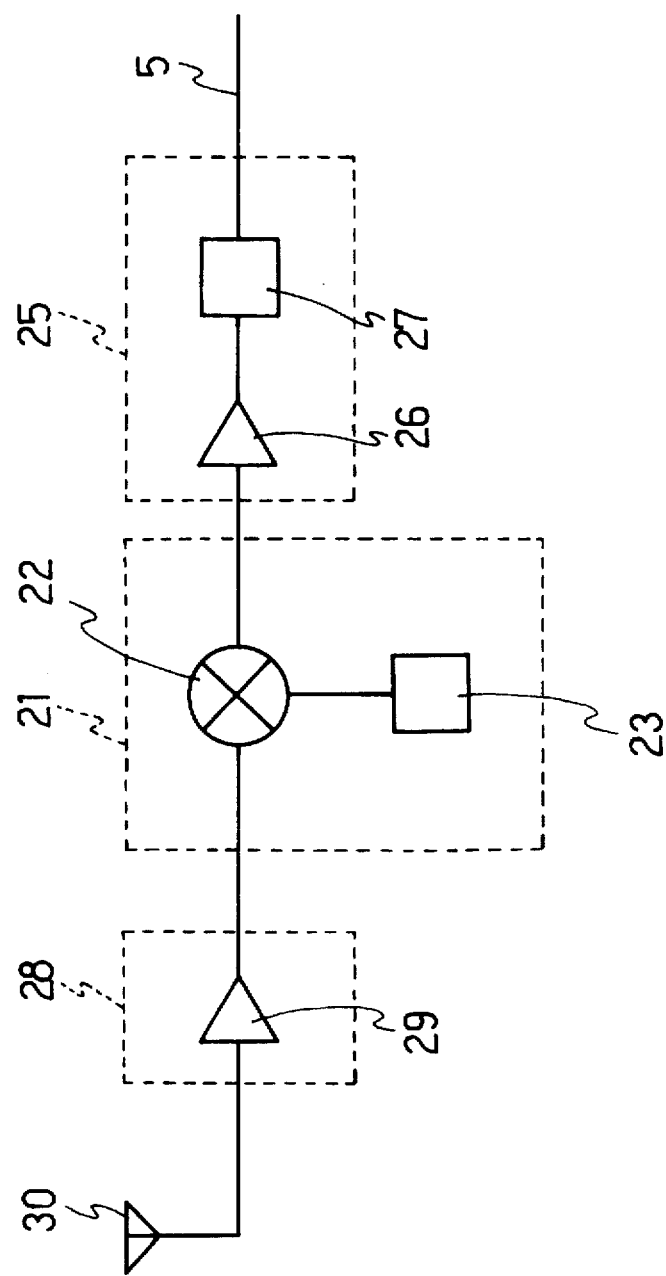
FIG. 9 is a circuit diagram of the frequency converter shown in FIG. 8.

FIG. 9 is a circuit block diagram of the frequency converter to be used for a communication system. The input signal from an antenna 30 is amplified by the input amplifier part 28 comprising amplifiers 29 including HEMT. The output of the amplifier part 28 is led into the low temperature frequency converting part 21. The output from the local oscillator 23 including a superconductive device and the output from the input amplifier part 28 are mixed in a frequency mixer 22. The resulting output having down-converted signal is led into the output signal amplifying part 25. Consequently, the output signal, which is amplified in the output amplifier 26 including GaAs transistor, is taken out to the transmission line for the output 5 through the band-pass filter 27.

Figure 10:
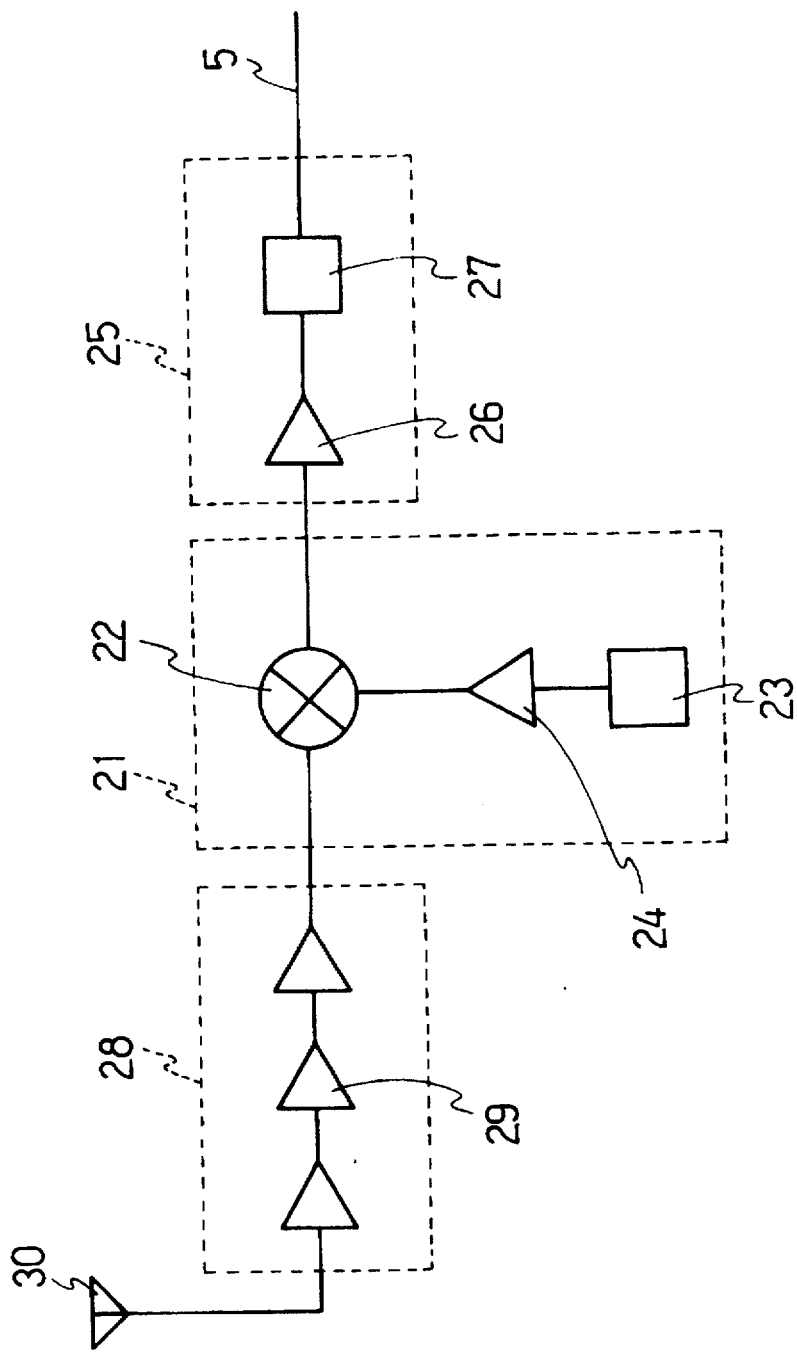
FIG. 10 is a circuit diagram of the frequency converter of the prior art, which is illustrated for comparison with FIG. 9.

A circuit block diagram of a frequency converter in the prior art shown in FIG. 10 is compared with the configuration of the present invention. According to the configuration of the present invention, the superconductor devices used for the frequency mixing part 22 can operate sensitively with a small local oscillator power. Therefore, the number of the stages of the amplifier 29 in the input amplifier part 28 can be reduced. The amplifier 24 of the local oscillator part can be eliminated. As a result, it is possible to make the circuit small.

Figure 11:
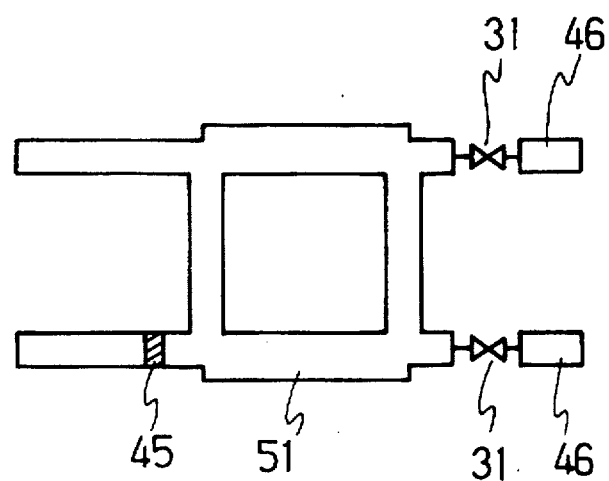
FIG. 11 is a conceptional view which shows another construction of the frequency converter as a high frequency circuit.

FIG. 11 shows an alternative example of the frequency convertor for the high frequency circuit. A frequency oscillator 45 comprising superconductor devices and two Josephson devices 31 is connected to a branchline type coupler 51. The high frequency oscillator 45 is operated with a current bias so as to obtain the desired voltage. The high frequency signal is input at the other input port of the branchline type coupler 51 so that the signal having the difference between the above signals can be obtained at the ports connected to the Josephson devices. Consequently, the frequency converting operation is performed by heterodyne detection. The use of the Josephson device 31 as a nonlinear device provides the highly sensitive frequency converter. However, other semiconductor devices such as a Shottky diode may be used.

The invention will be explained in further detail with reference to the following examples.

Example 1

According to this example, a multichannel oscillator comprising Josephson devices was made as a high frequency circuit. A GM type refrigerator was used for a temperature controlling system. The multichannel oscillator was made by the use of the Josehpson devices as follows: providing a substrate made of MgO single crystal whose thickness is 0.5 mm; patterning the Josephson devices and high frequency transmission line thereon; making the transmission line by the use of the microstrip type transmission line consisting of Au film; and making a ground plane by forming Au film on the entire surface of the back side of the substrate.

The superconductive device is the step edge type Josephson device having "123" crystalline structure made of yttrium oxide compound superconductor. The device has the same configuration as that reported in "Jpn. J. Appl. Phys. 31 (1991) 3907–3910" by Yoshito Fukumoto et al. The devices were made by using differences in level formed on a surface of the substrate, through the steps of processing a substrate, forming the superconductive thin film, and patterning. Then, a high frequency circuit was made by forming an Au film on the entire surface of the substrate and then forming the transmission line pattern or various pads.

The above configuration of the device is suitable for arraying the Josephson devices in series or in parallel.

According to the example, ten devices were joined in series so as to operate as a Josephson oscillator device. For the driving power source, an outside circuit was used. The driving power source was connected to the ends of the Josephson device array and then direct current was provided to the Josephson device. In order to take out the oscillation power effectively, the transmission line was directly connected to the electrode of the Josephson device. In order not to provide the direct current to the transmission line, it is preferable that a DC block was inserted between the transmission line and the Josephson device. Alternatively they may be connected with capacitance.

The output was divided into four systems. Each system has a band-pass filter having a different center frequency from the other filters. Then, the source voltage of the oscillator was varied. As a result, only when the frequency is identified with the passing frequency of each filter, was the output obtained at the corresponding terminal. Thus, a high frequency oscillator that allowed switching or varying in frequency could be made.

The oscillating device was contained in the high frequency package made of copper or brass that was screwed to the cooling head (cooling stage) of the two-stage type GM refrigerator. In order to enhance the thermal conductivity, grease was applied between the high frequency package and the cooling head. It was effective to use conductive paste or soldering paste instead of the grease. Moreover, the cooling part was surrounded by a gold-plated copper thermal radiation shield or Permalloy magnetic shield, further surrounded by the stainless steel outer vessel. Then the pressure in the vessel was reduced. Consequently, an influence from the outside electric noise was reduced, and the thermal influence from the outside was diminished so that the high frequency circuit was improved in thermal stability. The cooling head was kept at constant temperature (above 12K) by placing a temperature sensor on the cooling head and sending feedback from the output of the sensor to the electric power source of the GM refrigerator. Consequently, the operational stability of the high frequency circuit was much enhanced.

According to the example of the present invention, the GM type refrigerator was used. However, even a Stirling refrigerator or a Joule-Thomson type refrigerator also could be used. For operation at the temperature of 77K, a Dewar vessel using liquid nitrogen for a coolant may be used as the temperature controlling system.

Example 2

The high frequency oscillating system using the Josephson device according to an alternative example will be explained. According to the present invention, MgO single crystal whose thickness is 0.5 mm was used for the substrate, and the Josephson device and the high frequency transmission line were made thereon. A microstrip type transmission line comprising superconductor and an Au film was used for the transmission line. A ground side was made by forming Au film on the entire surface of the back side of the substrate. The superconductive device was a multilayered Josephson device using the "2212" phase bismuth oxide superconductor, which was the same configuration as that reported in "Appl. Phys. Lett. 56 (1990) 1469–1471; Jpn. J. Appl. Phys. 30 (1991) L1559–L1561" by Koichi Mizuno et al. The device comprises a multilayered thin film formed in the same vacuum condition. The structure of the device is suitable for arraying the Josephson devices in parallel.

The superconductor devices were made by forming the multilayered thin film including superconductive film and several patterning processes. The high frequency oscillating circuit was made by forming an Au film on the entire surface, and making transmission line pattern and various pads thereon. According to the example, three devices were connected in parallel to make a superconductive module. Ten superconductive modules were placed in series, and adjacent modules were connected with thin film capacitors for high frequency so as to operate as a high frequency devices. The device resistance of a single Josephson device is approximately $1\Omega$ and becomes approximately $15\Omega$ including a contact resistance of the electrode. Consequently, the whole impedance may be $50\Omega$ when connecting three the Josephson devices in parallel and connecting ten modules in series. For the driving power source, an outside circuit was used. The driving power source was connected to the ends of the Josephson device array and direct current was provided to the Josephson device. In order to oscillate effectively at the center frequency of 20 GHz, a resonator having a half wavelength was joined to the high frequency transmission line.

When cooling the device down to a temperature below 50K, the superconductor devices operated as the Josephson devices. Additionally, the device was recognized to operate as a high frequency oscillating device by providing current to the bias line.

Metallic materials (e.g. Nb, Nb-alloy, Pb, Pb-alloy or the like) may be used for the superconductor device. The other high temperature oxide superconductors (e.g. Y system, Tl system, Hg system or the like) may also be used. Not only the above-mentioned superconductors and Au but also other metallic materials (e.g. Pt, Cu, Ag, or alloy of them, or alloy including Au) may be used for making the high frequency transmission line. Actually, it is preferable that the material showing the minimum resistance in the range of the working frequency is used.

It is also preferable that materials having low dielectric loss in the high frequency are used for the substrate materials. Sapphire or other dielectric materials can be used. In case of using the oxide superconductor, it is preferable that the lattice constant of the substrate materials is similar to that of the superconductor in order to obtain a good superconductive property. Therefore, perovskite single crystal such as $LaAlO_3$, $LaGaO_3$, and $LaSrO_3$ can be preferably used.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A high frequency system, comprising:
   a high frequency package housing a high frequency circuit including a high frequency transmission line, superconductive modules including a predetermined number of Josephson devices connected in parallel, and phase locking circuits that conduct at high frequency and couple the superconductive modules in series;
   a cooling unit having a low temperature stage in thermal contact with the high frequency package; and
   shielding case for housing the high frequency circuit and the low temperature stage.

2. The high frequency system according to claim 1, wherein the phase locking circuit comprises a thin film type capacitor.

3. The high frequency system according to claim 1, wherein the number of the superconductive modules is determined so as to provide impedance matching condition with the high frequency transmission line.

4. The high frequency system according to claim 1, wherein the superconductor device comprises an oxide superconductor.

5. The high frequency system according to claim 1, wherein a high frequency amplifier comprising semiconductor devices is placed adjacent to the high frequency transmission line.

6. The high frequency system according to claim 1, wherein a resonator is placed adjacent to the high frequency transmission line.

7. The high frequency system according to claim 1, wherein the high frequency transmission line has a resonance construction.

8. The high frequency system according to claim 1, wherein a space occupied by the superconductor modules is along the high frequency transmission line and less than one-eighth of the electric wavelength of the resonant frequency.

9. The high frequency system according to claim 1, wherein the superconductor modules are spaced at distances corresponding to multiples of a half wavelength along the high frequency transmission line.

10. The high frequency system according to claim 1, wherein the high frequency circuit further comprises a coupler having input/output ports and a nonlinear device which is placed between the output terminal of the connecting line and the high frequency transmission line.

11. The high frequency system according to claim 1, which further comprises resonators having different center frequencies.

12. The high frequency system according to claim 11, wherein the resonators are made of an oxide superconductor.

* * * * *